United States Patent [19]

Bartholomew

[11] Patent Number: 5,311,120
[45] Date of Patent: May 10, 1994

[54] TEST FIXTURE WITH TEST FUNCTION FEATURE

[76] Inventor: Mark R. Bartholomew, 2232 S. Hickory Pl., Ontario, Calif. 91761

[21] Appl. No.: 1,074

[22] Filed: Jan. 6, 1993

[51] Int. Cl.⁵ .................... G01R 31/02; G01R 1/073
[52] U.S. Cl. ............................ 324/158 F; 324/158 P
[58] Field of Search ............... 324/158 F, 158 P, 72.5, 324/73.1

[56] References Cited

U.S. PATENT DOCUMENTS

| | | | |
|---|---|---|---|
| 3,833,853 | 9/1974 | Milford | 324/72.5 |
| 3,996,516 | 12/1976 | Luther | 324/158 F |
| 4,115,735 | 9/1978 | Stanford | 324/158 F |
| 4,340,858 | 7/1982 | Malloy | 324/158 P |
| 4,352,061 | 9/1982 | Matrone | 324/158 F |
| 4,357,062 | 11/1982 | Everett | 324/158 F |
| 4,443,756 | 4/1984 | Lightbody et al. | 324/158 F |
| 4,517,512 | 5/1985 | Petrich et al. | 324/158 F |
| 4,625,164 | 11/1986 | Golder et al. | 324/158 F |
| 4,626,776 | 12/1986 | Wilkinson | 324/158 P |
| 4,626,779 | 12/1986 | Boyle | 324/158 P |
| 4,686,467 | 8/1987 | DeLapp et al. | 324/158 F |
| 4,730,159 | 3/1988 | Collins | 324/158 F |
| 4,758,780 | 7/1988 | Coon et al. | 324/73.1 |
| 4,788,496 | 11/1988 | Maelzer et al. | 324/158 F |
| 4,803,424 | 2/1989 | Ierardi et al. | 324/158 F |
| 4,814,698 | 3/1989 | St. Onge et al. | 324/158 F |
| 4,851,765 | 7/1989 | Driller et al. | 324/158 F |
| 4,884,024 | 11/1989 | DiPerna | 324/158 F |
| 4,899,104 | 2/1990 | Maelzer et al. | 324/158 F |
| 4,904,935 | 2/1990 | Calma et al. | 324/158 F |
| 4,935,696 | 6/1990 | DiPerna | 324/158 F |
| 4,963,822 | 10/1990 | Prokopp | 324/158 P |
| 4,967,148 | 10/1990 | Doemens et al. | 324/158 F |
| 4,977,370 | 12/1990 | Andrews | 324/158 F |

*Primary Examiner*—Ernest F. Karlsen
*Attorney, Agent, or Firm*—Denton L. Anderson

[57] ABSTRACT

An apparatus is provided for testing both the integrity and the functionality of the electrical circuit tracings on a printed circuit board. The apparatus is a bed-of-nails test fixture. The device has a plurality of parallel test probes affixed to the bottom plate of the fixture. The plurality of test probes consists of a plurality of short probe members and a plurality of long probe members. The height of the long probe members is telescopically alterable between the height of the short probe members and the maximum height of the long probe members. The long probe members have an internal spring which tends to maintain the long probe members at their maximum height. The device also has two slide bars disposed on opposite sides of the fixtures. The slide bars have a plurality of key hole shaped apertures. Affixed within the bottom plate of the fixture is a corresponding plurality of holding pins, each having a head dimensioned to pass through the wide portion of a key hole shaped aperture but not the narrow portion. Each of the holding pins is aligned with a corresponding key hole shaped aperture.

6 Claims, 3 Drawing Sheets

TEST FIXTURE WITH TEST FUNCTION FEATURE

FIELD OF THE INVENTION

This application relates generally to fixture devices for testing printed circuit boards and the like, and, specifically, to test fixture devices capable of testing the functionality of a printed circuit board.

BACKGROUND OF THE INVENTION

Printed circuit boards are an increasingly common component in all types of electronic devices. Electronic circuit boards are easy and inexpensive to manufacture, install and use. By eliminating the need for a "spaghetti bowl" of hard wire connections, complex electronic equipment can be made less expensively and much more compactly.

Printed circuit boards generally comprise a board constructed from an insulating material such as a glass-fiber-reinforced epoxy resin. The board can be rigid or it can be relatively flexible. Onto the board are formed by "printing" techniques, a plurality of electrically conductive circuitry tracks. These tracks are then connected to various electrical components which are affixed to the board.

It is common practice in the industry to conduct an integrity test on each newly manufactured printed circuit board to be sure there are no broken or disconnected circuits on the board. The testing procedure entails making electrical contact between a number of predetermined locations on the printed circuitry and specially adapted electrical diagnostic equipment which measures an integrity parameter at each predetermined location and compares it to a standard value.

Contacting the various points along the electronic circuitry is typically accomplished by placing the printed circuit board on a test fixture device and bringing the circuitry into contact with a plurality of test probes, each of which is electrically connected to the diagnostic equipment. An electrical charge is applied at points along the circuitry and the resulting electrical characteristics at each of the predetermined locations are measured using the probes and compared by the diagnostic equipment with the standard values.

It is also frequently desirable to test the functionality of the completed circuit board. In a functionability test, a second, smaller number of test probes are placed into contact with the input, the output, and a selected set of predetermined locations along the printed circuitry. An electrical current is applied to the input points and the functional aspects of the circuitry are measured by a second kind of electrical diagnostic equipment.

Heretofore, it has been necessary to conduct the integrity test and the functionality test with two separate sets of test probes, generally in two separate test fixtures. It would be highly desirable, however, if these two different tasks could be accomplished on a single test fixture. This would cut both the cost of the testing equipment and the time involved in the testing procedure by at least fifty percent.

SUMMARY OF THE INVENTION

The invention provides such a device. The device is an apparatus for testing the electrical circuit tracings on a printed circuit board comprising:

(a) a top plate and a bottom plate disposed in parallel with one other, the plates being movable with respect to one another between a first plate position wherein the top plate is distal to the bottom plate and a second plate position wherein the top plate is proximate to the bottom plate, the top plate having an upper surface and a lower surface;

(b) means for moving the plates between the first plate position and the second plate position;

(c) means for urging the plates toward the first plate position;

(d) means for affixing a printed circuit board to the upper surface of the top plate;

(e) a plurality of apertures defined within the top plate and aligned with a loci of points along the circuit tracings of a printed circuit board affixed to the top plate;

(f) a plurality of parallel test probes affixed to the bottom plate so as to be perpendicular to the bottom plate and so as to be positionally disposed between the bottom plate and the top plate when the plates are in the first plate position, each test probe being aligned with a corresponding aperture in the top plate, the plurality of test probes comprising a plurality of short probe members having a first probe height and a plurality of long probe members having a second probe height, each of the long probe members comprising an inner moiety telescopically disposed within an outer moiety, the height of the long probe members being telescopically alterable between the second probe height and the first probe height and the long probe members each comprising means for urging the long probe member to the second probe height;

(g) means for electrically connecting each of the test probes to electrical signal diagnostic equipment;

(h) at least one slide bar slidably affixed in abutment to the upper surface of the top plate, the slide bar having at least one key hole shaped aperture, the key hole shaped aperture having a wide portion and a narrow portion;

(i) at least one holding pin affixed to the bottom plate so as to be perpendicular to the bottom plate and so as to be positionally disposed between the bottom and top plates when the plates are in the first plate position, the holding pin comprising a shaft dimensioned to pass through both the narrow portion and the wide portion of the key hole shaped aperture in the slide bar and a head dimensioned to pass through the wide portion but not the narrow portion of the key hole shaped aperture in the slide bar; and (j) means for sliding the slide bar between a first slide bar position wherein the wide portion of the key hole shaped aperture is aligned with the holding pin and a second slide bar position wherein the narrow portion of the key hole shaped aperture is aligned with the holding pin;

wherein the top plate is perforated directly below the key hole shaped aperture in the slide bar to allow passage of the holding pin therethrough.

The means for moving the plates between the first plate position and the second plate position can be a purely mechanical means. In a typical embodiment, however, such means are provided by suitable equipment adapted to draw a vacuum between the first and second plates.

The device of the invention can be used for conducting both an integrity test and a function test on a printed circuit board by a method comprising the following steps:

(a) affixing the printed circuit board to the top plate of the test fixture device of the invention described above;

(b) with the slide bar in the first slide bar position, activating the plate moving means to move the plates to the second plate position so that the holding pins protrude through the key hole shaped apertures in the slide bar and so that the short probes come into contact with predetermined short probe locations on the circuit tracings and the long probes come into contact with predetermined long probe locations on the circuit tracings;

(c) conducting a circuitry integrity test by applying an electrical charge to the circuit tracings and comparing at least one measured circuitry integrity parameter at each short probe predetermined location to a corresponding standard value;

(d) activating the sliding means to slide the slide bar to the second slide bar position;

(e) deactivating the plate moving means so that the plates move toward the second plate position but are prevented from fully moving to the second plate position by the cooperation of the holding pin and the slide bar, whereby the short probes lose contact with the circuit tracings but each of the long probes maintains contact with its predetermined long probe location; and (f) conducting a circuitry function test by applying an electrical potential to the circuit tracing and comparing at least one measured circuitry function parameter at each of the predetermined long probe locations to a corresponding standard value.

The invention provides, in one testing device, a means for testing a printed circuit board for both the integrity of the circuitry connections and for the functionality of the circuitry. This testing device is much less expensive to manufacture than the two separate testing devices required in the past. Furthermore, the man power cost for testing each circuit board for integrity and functionality is markedly reduced due to the fact that the boards need only be handled once instead of twice.

DESCRIPTION OF THE DRAWINGS

These and other features, aspects and advantages of the present invention will become understood with reference to the following description, appended claims and accompanying drawings, wherein:

DESCRIPTION OF THE INVENTION

Figure 1:
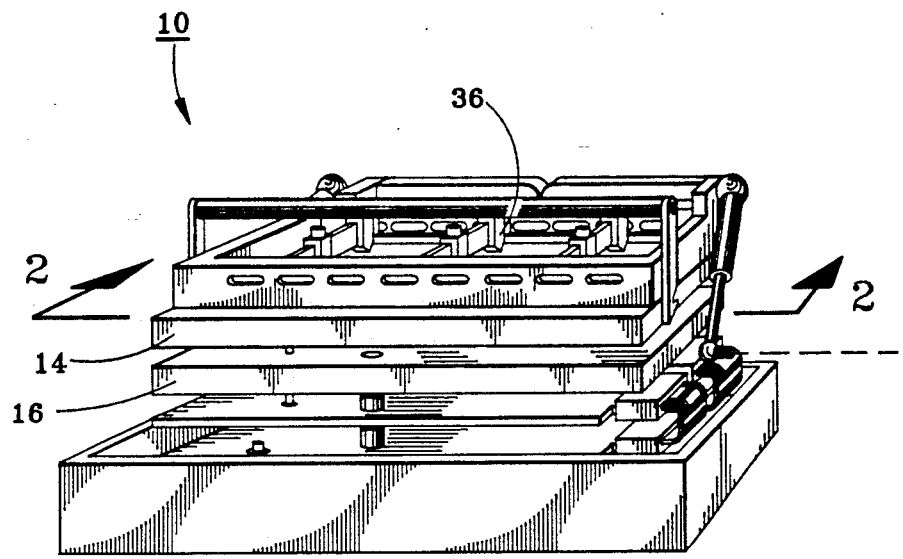
FIG. 1 is a perspective view of a test fixture having features of the invention.
Figure 2:
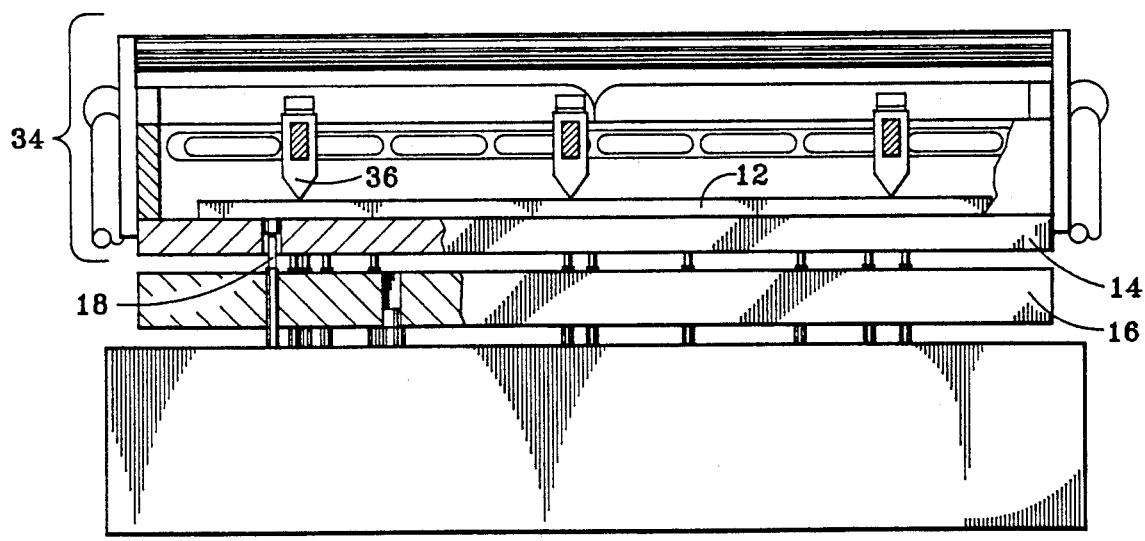
FIG. 2 is a side view in partial cross-section of the test fixture of FIG. 1 taken along line 2—2.
Figure 3:
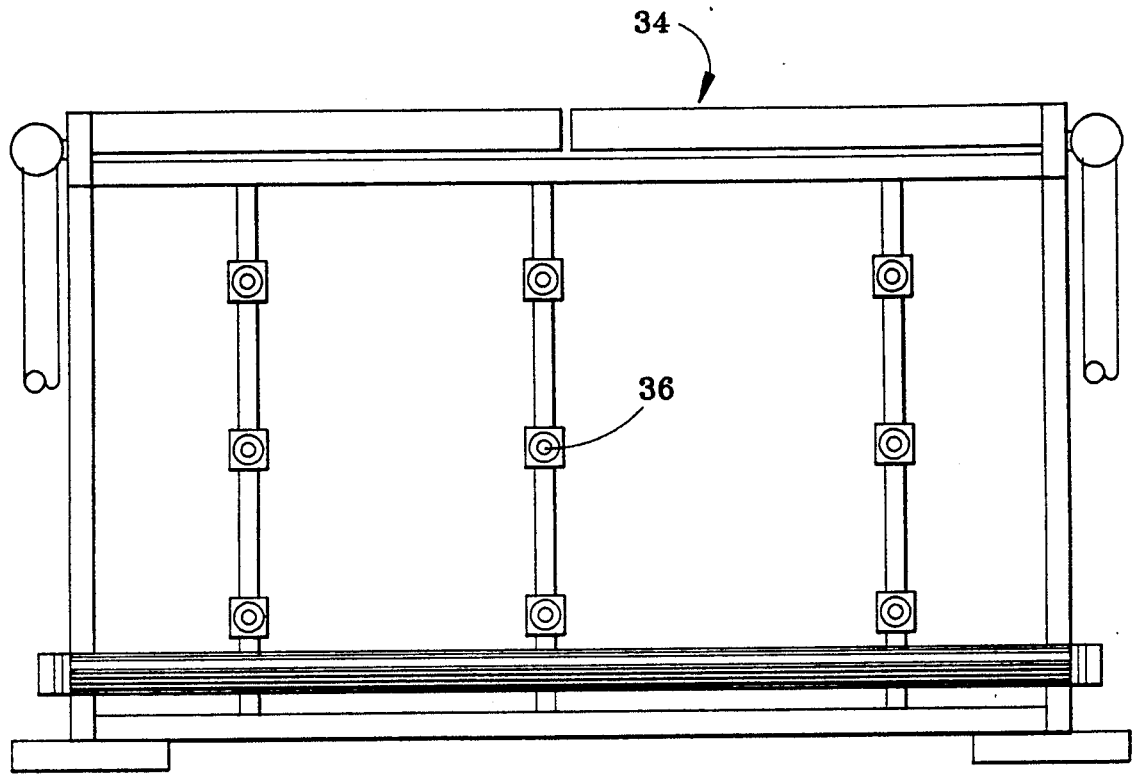
FIG. 3 is a top view of a gate structure useful in the invention.

The invention is an apparatus 10 for testing the electrical circuit tracings on a printed circuit board 12. The apparatus 10 comprises (1) a top plate 14, (2) a bottom plate 16, (3) means for moving the plates 14 and 16, (4) means for urging the plates 14 and 16 towards each other, (5) means for affixing the printed circuit board 12 to the top plate 14, (6) a plurality of test probes 18 affixed to the bottom plate 16, (7) means for electrically connecting each of the test probes 18 to electrical signal diagnostic equipment, (8) at least one slide bar 20 having at least one key hole aperture 22, (9) at least one holding pin 24, and (10) means for sliding the slide bar 20 laterally across the upper surface of the top plate 14.

The top plate 14 has a generally planar upper surface 26 and lower surface 28. Similarly, the bottom plate 16 has a generally planar upper surface 30 and lower surface 32. Both plates 14 and 16 are made from a non-conductive material such as G-10 or an equivalent material.

In a typical embodiment the surface area of the top plate 14 is approximately the same as that of the bottom plate 16. The surface areas of the top and bottom and plates 14 and 16 are not critical as long as they are dimensioned to be larger than the printed circuit board 12 to be tested.

The top plate 14 and the bottom plate 16 are disposed in parallel with one another. The plates 14 and 16 are movable with respect to one another between a first plate position wherein the top plate 14 is distal to the bottom plate 16 and a second plate position wherein the top plate 14 is proximate to the bottom plate 16. In a typical embodiment, the top plate 14 and bottom plate 16 are separated by between about 0.375 and about 0.062 inches in the first plate position and between about 0.25 and about 0.30 inches in the second plate position. In the most common embodiment, the bottom plate 16 is positionally fixed and the top plate 14 is movable. However, the top plate 14 can be positionally fixed and the bottom plate 16 movable.

The means for moving the plates 14 and 16 between the first and second plate positions can be provided by a vacuum system (not shown) which is adapted to draw a vacuum between the top plate 14 and bottom plate 16. Such a vacuum system is well known in the art and is described generally in U.S. Pat. No. 4,814,698 which is incorporated herein in its entirety, for all purposes, by this reference. The means for moving the plates 14 and 16 between the first and second plate positions can alternatively be provided by mechanical or pneumatic means.

The means for urging the plates 14 and 16 away from each other and towards the first plate position is generally provided by coiled springs (not shown) disposed between the top plate 14 and the bottom plate 16. Other resilient materials and devices, including air cylinders can also be used to provide the means for urging the plates 14 and 16 towards the first plate position.

The means for affixing the printed circuit board 12 to the upper surface 26 of the top plate 14 can comprise a narrow strip of resilient, electrically non-conductive material 41 affixed directly to the upper surface 26 of the top plate 14. The narrow strip 41 is generally disposed on the upper surface 26 of the top plate 14 in a pattern calculated to support the peripheral edge of the printed circuit board 12 to be tested. In embodiments using a vacuum induced between the top plate 14 and the bottom plate 16, the printed circuit board 12 is held to the top plate 14 by the force of the vacuum.

Figure 7:
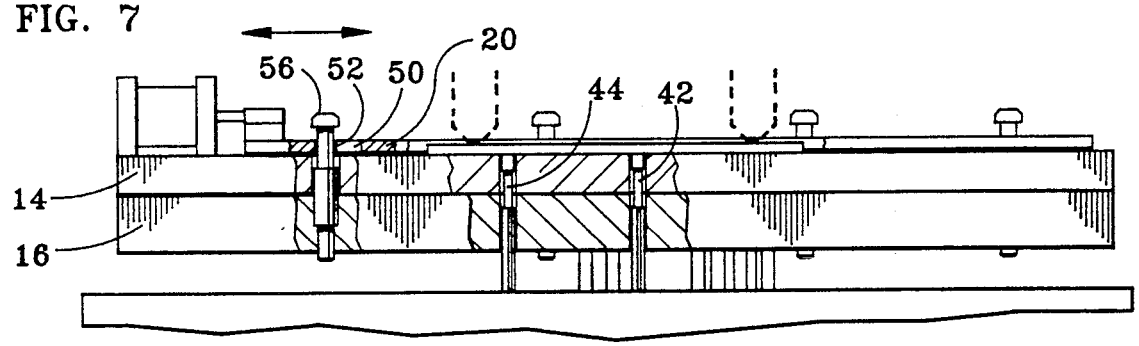
FIG. 7 is a side view in partial cross-section of the top plate and the bottom plate portion of a fixture having features of the invention showing the top and bottom plates in a first plate position wherein the top plate and the bottom plate are proximate to one another with the holding pin protruding through the narrow portion of the key hole aperture in the slide bar.
Figure 8:
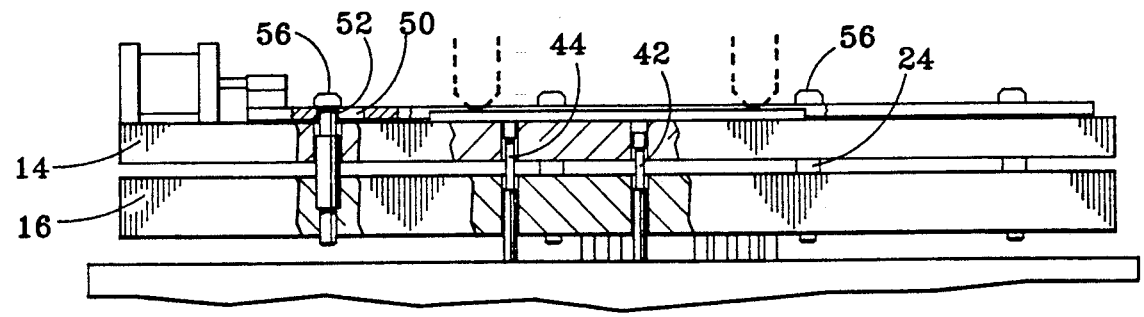
FIG. 8 is a side view in partial cross-section of the top plate and the bottom plate portion of a fixture having features of the invention showing the top and bottom plates between the first plate position and the second plate position with the holding pin protruding through the narrow portion of the key hole aperture in the slide bar.

The means for affixing the circuit board 12 to upper surface 26 can also be a gate device 34 as shown on FIGS. 7-9. Such a gate device 34 is especially useful for testing printed circuit boards 12 which have openings in them at the time of the test (and, therefore, cannot be held against the upper surface 26 by a vacuum). In the gate device 34, a plurality of fingers 36 are disposed downwardly against the printed circuit board 12 to urge the circuit board 12 downwardly towards the top plate 14. The fingers 36 can be powered downwardly by a motor and suitable mechanical linkage (not shown). However, it is generally simpler and less expensive to power the fingers 36 downwardly by a vacuum drawn within suitable vacuum cylinders (not shown) attached to the fingers 36 by appropriate linkage equipment (not shown).

The top plate 14 has a plurality of apertures 40 running clear through the thickness of the top plate 14 between the lower surface 28 and the upper surface 26. Each of the apertures 40 is aligned with predetermined points along the circuit tracings of the circuit board 12 to be tested.

The plurality of parallel test probes 18 are fixed to the bottom plate 16 so as to be perpendicular to the bottom plate 16 and so as to be positionally disposed between the bottom plate 16 and the top plate 14 when the plates 14 and 16 are in the first plate position. Each of the test probes 18 is aligned with a corresponding aperture 40 in the top plate 14 so that, when the plates 14 and 16 are in the second plate position, each probe 18 protrudes through an aperture 40 in the top plate 14. In a typical embodiment each of the probes 18 has a diameter between about 0.025 inches and about 0.125 inches.

The test probes 18 are comprised of a plurality of short probe members 42 having a first probe height and a plurality of long probe members 44 having a second probe height. Each of the long probe members 44 has an inner moiety 46 telescopically disposed within an outer moiety 48. The height of the long probe members 44 is thereby telescopically alterable between the second probe height and a lesser probe height which is at least as short as the first probe height. The long probe members 44 also have some sort of means for urging each of the long probe members 44 to the second probe height. This means can generally be provided by a small coiled spring (not shown) disposed within the outer moiety 48 and adapted for applying pressure to the bottom of the inner moiety 46 so as to urge the inner moiety 46 away from the base of the outer moiety 48.

Typically, the short probe members 42 are also telescopically alterable between the first probe height and a lesser probe height. A coiled spring is generally used in such short probe members 42 to urge the two moieties of such telescopically alterable short probe members 42 to their maximum heights. This telescoping feature of the short probe members 42 minimizes damage to the tracings on the printed circuit board 12.

The first probe height and the second probe height are not critical so long as the first probe height is sufficient to allow the short probe members 42 to traverse the thickness of the top plate 14 and to make contact with the circuit tracings on the printed circuit board 12 when the plates 14 and 16 are in the second plate position. In a typical embodiment, the first probe height is between about 0.4 and about 0.625 inches and the second probe height is between about 0.625 and about 0.8 inches.

Each of the probes 18 is aligned with a corresponding aperture 40 in the top plate 14 so that, when the plates 14 and 16 are moved to the second plate position, each of the probes 18 is drawn through a corresponding aperture 40 in the top plate 14 and into contact with a predetermined point along the circuit tracings of the printed circuit board 12.

Each of the test probes 18 is electrically connected to suitable electrical signal diagnostic equipment (not shown) designed and adapted to receive an electrical signal from each of the predetermined points along the circuit tracings and comparing each of those signals to a standard value. Each of the probes 18, therefore, is connected to the electrical signal diagnostic equipment by suitable connection means. Such means can comprise any of the many ways of completing an electrical circuit, including wires, circuit tracings, ribbon cable, etc.

Figure 4:
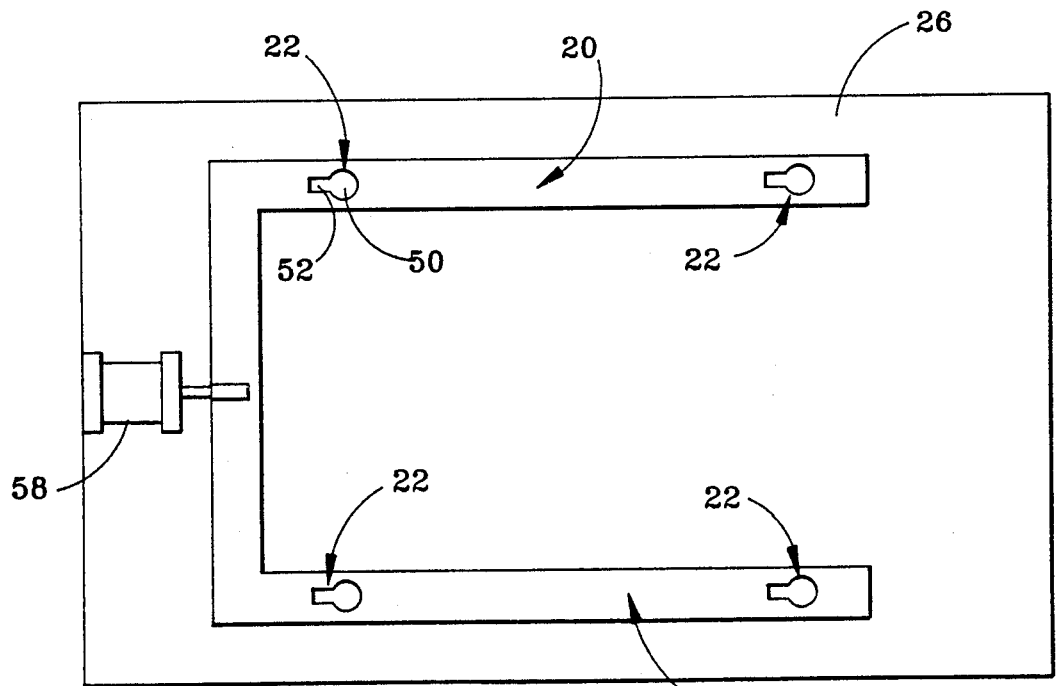
FIG. 4 is a top view of a test fixture top plate and pair of slide bars having features of the invention.
Figure 5:
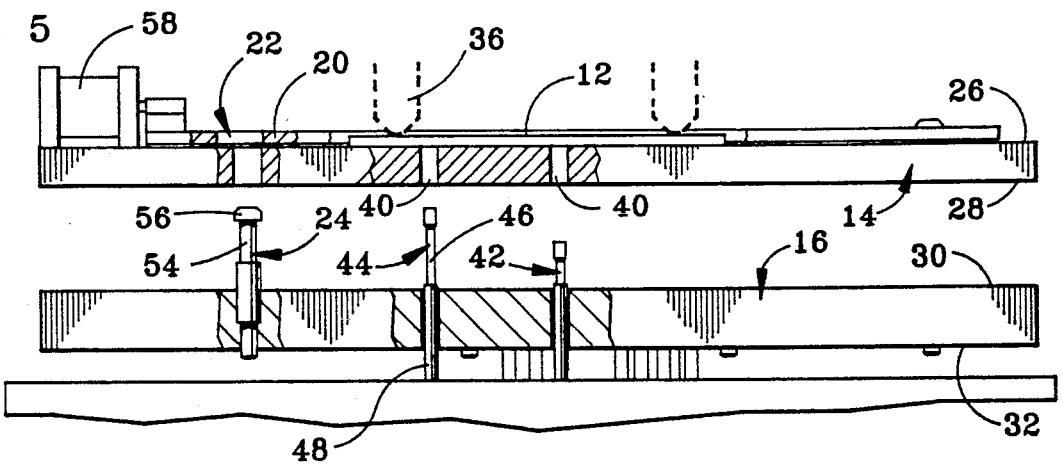
FIG. 5 is a side view in partial cross-section of the top plate and the bottom plate portion of a fixture having features of the invention showing the top and bottom plates in a first plate position wherein the top plate and the bottom plate are distal to one another.
Figure 6:
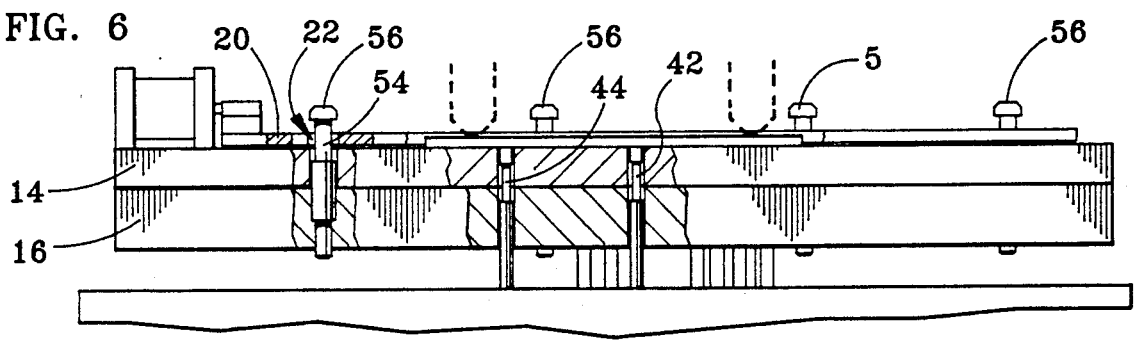
FIG. 6 is a side view in partial cross-section of the top plate and the bottom plate portion of a fixture having features of the invention showing the top and bottom plates in a first plate position wherein the top plate and the bottom plate are proximate to one another with the holding pin protruding through the wide portion of the key hole aperture in the slide bar.

At least one slide bar 20 is slidably affixed to the upper surface 26 of the top plate 14 in abutment with the upper surface 26 of the top plate 14. In the embodiment shown in FIG. 4, two parallel slide bars 20 are used, each disposed in parallel with one another on along opposite edges of the upper surface 26 of the top plate 14. Each slide bar 20 has at least one key hole shaped aperture 22, having a wide portion 50 and a narrow portion 52. In the typical embodiment shown in FIG. 4, two parallel slide bars 20 are used, each having two key hole shaped apertures 22, one at each end of each slide bar 20.

Corresponding to each key hole shaped aperture 20 is a holding pin 24 affixed to the bottom plate 16 so as to be perpendicular to the bottom plate 16 and be positionally disposed between the bottom plate 16 and the top plate 14 when the plates 14 and 16 are in the first plate position. Each holding pin 24 has a shaft 54 dimensioned to pass through the narrow portion 52 of the key hole shaped aperture 22 and a head 56 dimensioned to pass through the wide portion 50 of the key hole shaped aperture 22 but not the narrow portion 52.

Each holding pin 24 is aligned with a corresponding key hole shaped aperture 22 and the top plate 14 is perforated directly below each key hole shaped aperture 22 so that, when the plates 14 and 16 are moved from the first plate position to the second plate position, the holding pin 24 is thrust through the top plate 14, through a key hole shaped aperture 22 and protrudes above the slide bar 20.

The slide bar 20 is slidable between a first slide bar position wherein the wide portion 50 of each key hole aperture 22 is aligned with a corresponding holding pin 24 and a second slide bar position wherein the narrow portion 52 of each key hole shaped aperture 22 is aligned with a corresponding holding pin 24. A means for sliding each slide bar 20 between the first slide bar position and the second slide bar position is provided by a suitable electric motor, solenoid or other appropriate means. In the drawings the means for sliding the slide bar is provided by solimoid 58.

Thus, when each slide bar 20 is in the first slide bar position, each of the holding pins 24 can freely pass through the slide bar 20 via the wide portion 50 of the key hole shaped aperture 22. However, when each slide bar 20 is in the second slide bar position, the shaft 54 of each holding pin 24 can pass through the slide bar 20 via the narrow portion 52 of its corresponding key hole shaped aperture 22, but not the head 56 of the holding pin 24.

The height of the short probe members 42, long members 44 and holding pins 24 are chosen such that (1) when the plates 14 and 16 are in the first plate position, none of the test probes 18 contacts the printed circuit board 12; (2) when the plates 14 and 16 are in the second plate position, all of the test probes 18 contact the printed circuit board 12; and (3) when the plates 14 and 16 are first placed into the second plate position with the slide bar 20 moved to the second slide bar position, and when the plate moving means is deactivated so that the plates 14 and 16 are urged apart by the means, the plates 14 and 16 separate from one another by a distance sufficient for the short probe members 42 to lose contact with the printed circuit board 12 but insufficient for the long probe members 14 to lose contact with the printed circuit board 12.

In operation, both the short probe members 42 and the long probe members 44 can be used in an integrity test of the printed circuit board 12, while the long probe members 44 alone are used in the functionality test of the circuit board 12. Both an integrity test and a functionality test can be performed on the apparatus of the invention by the steps of:

(a) affixing the printed circuit board 1 to the upper surface 26 of the top plate 14;

(b) with the slide bar 20 in the first slide bar position, activating the plate moving means to move the plates 14 and 16 to the second plate position so that the holding pins 24 protrude through the key hole shaped apertures 22 in the slide bar 20 and so that the short probe members 42 come into contact with predetermined short probe locations on the circuit tracings and the long probe members 44 come into contact with predetermined long probe locations on the circuit tracings;

(c) conducting a circuitry integrity test by applying an electrical charge to the circuit tracings and comparing at least one measured circuitry integrity parameter at each short probe predetermined location to a corresponding standard value;

(d) activating the sliding means to slide the slide bar 20 to the second slide bar position;

(e) deactivating the plate moving means so that the plates 14 and 16 move toward the first plate position but are prevented from fully moving to the first plate position by the cooperation of the heads 56 of the holding pins 24 and the slide bar 20, whereby the short probe members 42 lose contact with the circuit tracings but each of the long probe members 44 maintain contact with its predetermined long probe location; and (f) conducting a circuitry function test by applying an electrical potential to the circuit tracing and comparing at least one measured circuitry function parameter at each of the predetermined long probe locations to a corresponding standard value.

Although the present invention has been described in considerable detail with reference to certain preferred versions, many other versions should be apparent to those skilled in the art. Therefore, the spirit and scope of the appended claims should not necessarily be limited to the description of the preferred versions contained therein.

What is claimed is:

1. An apparatus for testing the electrical circuit tracings on a printed circuit board comprising:

(a) a top plate and a bottom plate disposed in parallel with one other, the plates being movable with respect to one another between a first plate position wherein the top plate is distal to the bottom plate and a second plate position wherein the top plate is proximate to the bottom plate, the top plate having an upper surface and a lower surface;

(b) means for moving the plates between the first plate position and the second plate position;

(c) means for urging the plates toward the first plate position;

(d) means for affixing a printed circuit board to the upper surface of the top plate;

(e) a plurality of apertures defined within the top plate and aligned with a loci of points along the circuit tracings of a printed circuit board affixed to the top plate;

(f) a plurality of parallel test probes affixed to the bottom plate so as to be perpendicular to the bottom plate and so as to be positionally disposed between the bottom plate and the top plate when the plates are in the first plate position, each test probe being aligned with a corresponding aperture in the top plate, the plurality of test probes comprising a plurality of short probe members having a first probe height and a plurality of long probe members having a second probe height, each of the long probe members comprising an inner moiety telescopically disposed within an outer moiety, the height of the long probe members being telescopically alterable between the second probe height and the first probe height and the long probe members each comprising means for urging the long probe member to the second probe height;

(g) means for electrically connecting each of the test probes to electrical signal diagnostic equipment;

(h) at least one slide bar slidably affixed in abutment to the upper surface of the top plate, the slide bar having at least one key hole shaped aperture, the key hole shaped aperture having a wide portion and a narrow portion;

(i) at least one holding pin affixed to the bottom plate so as to be perpendicular to the bottom plate and so as to be positionally disposed between the bottom and top plates when the plates are in the first plate position, the holding pin comprising a shaft dimensioned to pass through both the narrow portion and the wide portion of the key hole shaped aperture in the slide bar and a head dimensioned to pass through the wide portion but not the narrow portion of the key hole shaped aperture in the slide bar; and (j) means for sliding the slide bar between a first slide bar position wherein the wide portion of the key hole shaped aperture is aligned with the holding pin and a second slide bar position wherein the narrow portion of the key hole shaped aperture is aligned with the holding pin;

wherein the top plate is perforated directly below the key hole shaped aperture in the slide bar to allow passage of the holding pin therethrough.

2. The apparatus of claim 1 wherein the first probe height is between about 0.4 and about 0.625 inches long.

3. The apparatus of claim 1 wherein the second probe height of the long probe members is between about 0.625 and about 0.8 inches.

4. The apparatus of claim 1 comprising two parallel slide bars.

5. The apparatus of claim 4 wherein each slide bar has a key hole shaped aperture at each of its two ends.

6. A method for testing the electrical circuit tracings on a printed circuit board comprising the steps of:
   (a) affixing the printed circuit board to the top plate of a test fixture device comprising:
      (1) a top plate and a bottom plate disposed in parallel with one other, the plates being movable with respect to one another between a first plate position wherein the top plate is distal to the bottom plate and a second plate position wherein the top plate is proximate to the bottom plate, the top plate having an upper surface and a lower surface;
      (2) plate moving means for moving the plates between the first plate position and the second plate position;
      (3) means for urging the plates toward the first plate position;
      (4) means for affixing a printed circuit board to the upper surface of the top plate;
      (5) a plurality of apertures defined within the top plate and aligned with a loci of points along the circuit tracings on the printed circuit board;
      (6) a plurality of parallel test probes affixed to the bottom plate so as to be perpendicular to the bottom plate and so as to be positionally disposed between the bottom plate and the top plate when the plates are in the first plate position, each test probe being aligned with a corresponding aperture in the top plate, the plurality of test probes comprising a plurality of short probe members having a first probe height and a plurality of long probe members having a second probe height, each of the long probe members comprising an inner moiety telescopically disposed within an outer moiety, the height of the long probe members being telescopically alterable between the second probe height and the first probe height and the long probe members further each comprising means for urging the long probe member to the second probe height;
      (7) means for electrically connecting each of the test probes to electrical signal diagnostic equipment;
      (8) at least one slide bar slidably affixed to the upper surface of the top plate, the slide bar having at least one key hole shaped aperture, the key hole shaped aperture having a wide portion and a narrow portion;
      (9) at least one holding pin affixed to the bottom plate so as to be perpendicular to the bottom plate and so as to be positionally disposed between the bottom and top plates when the plates are in the first plate position, the holding pin comprising a shaft dimensioned to pass through both the narrow portion and the wide portion of the key hole shaped aperture in the slide plate and a head dimensioned to pass through the wide portion but not the narrow portion of the key hole shaped aperture; and
      (10) sliding means for sliding the slide bar between a first slide bar position wherein the wide portion of the key hole shaped aperture is aligned with the holding pin and a second slide bar position wherein the narrow portion of the key hole is aligned with the holding pin;
   wherein the top plate is perforated directly below the key hole shaped aperture in the slide bar to allow passage of the holding pin therethrough;
   (b) with the slide bar in the first slide bar position, activating the plate moving means to move the plates to the second plate position so that the holding pin protrude through the key hole shaped apertures in the slide bar and so that the short probe members come into contact with predetermined short probe locations on the circuit tracings and the long probe members come into contact with predetermined long probe locations on the circuit tracings;
   (c) conducting a circuitry integrity test by applying an electrical charge to the circuit tracings and comparing at least one measure circuitry integrity parameter at each short probe predetermined location to a corresponding standard value;
   (d) activating the sliding means to slide the slide bar to the second slide bar position;
   (e) deactivating the plate moving means so that the plates move toward the second plate position but are prevented from fully moving to the second plate position by the cooperation of the holding pin and the slide bar, whereby the short probe members lose contact with the circuit tracings but each of the long probe members maintains contact with its predetermined long probe location; and
   (f) conducting a circuitry function test by applying an electrical potential to the circuit tracing and comparing at least one measured circuitry function parameter at each of the predetermined long probe locations to a corresponding standard value.

* * * * *